United States Patent
Kim et al.

(10) Patent No.: US 7,687,357 B2
(45) Date of Patent: Mar. 30, 2010

(54) SEMICONDUCTOR DEVICE AND METHOD FOR FABRICATING THE SAME

(75) Inventors: Yong-Soo Kim, Ichon-shi (KR); Hong-Seon Yang, Ichon-shi (KR); Seung-Ho Pyi, Ichon-shi (KR); Tae-Hang Ahn, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/965,679

(22) Filed: Dec. 27, 2007

(65) Prior Publication Data
US 2009/0001418 A1 Jan. 1, 2009

(30) Foreign Application Priority Data
Jun. 26, 2007 (KR) ............ 10-2007-0062779

(51) Int. Cl.
*H01L 21/8234* (2006.01)
*H01L 27/088* (2006.01)
(52) U.S. Cl. ............ 438/285; 438/198; 257/190; 257/E27.06; 257/E21.619
(58) Field of Classification Search ............ 257/192; 438/285
See application file for complete search history.

(56) References Cited

U.S. PATENT DOCUMENTS

| 6,861,318 | B2 | 3/2005 | Murthy et al. |
| 7,456,087 | B2 * | 11/2008 | Cheng ............ 438/584 |
| 2005/0285192 | A1 | 12/2005 | Zhu |
| 2007/0132038 | A1 * | 6/2007 | Chong et al. ............ 257/401 |
| 2008/0157119 | A1 * | 7/2008 | Tsai ............ 257/190 |
| 2008/0185612 | A1 * | 8/2008 | Fukuda et al. ............ 257/190 |
| 2008/0315254 | A1 * | 12/2008 | Fukuda et al. ............ 257/190 |

FOREIGN PATENT DOCUMENTS

| KR | 1020050121479 A | 12/2005 |
| KR | 1020060134772 A | 12/2006 |
| KR | 1020070061219 A | 6/2007 |
| KR | 1020070064231 A | 6/2007 |

OTHER PUBLICATIONS

Ota et al., "Scalable eSiGe S/D technology with less layout dependence for 45-nm generation," *VLSI Technology Digest of Technical Papers* (2006).
Thompson et al., "A 90-nm logic technology featuring strained-silicon," *IEEE Transactions on Electron Devices* 51:1790-1797 (2004).

* cited by examiner

*Primary Examiner*—Zandra Smith
*Assistant Examiner*—Lawrence Tynes, Jr.
(74) *Attorney, Agent, or Firm*—Townsend and Townsend and Crew LLP (57) ABSTRACT

A method for fabricating a transistor, the method includes forming a gate over a substrate to form a first resultant structure, forming a gate spacer at first and second sidewalls of the gate, etching portions of the substrate proximate to the gate spacer to form a recess in a source/drain region of the substrate, forming a first epitaxial layer including germanium to fill the recess, and performing a high temperature oxidation process to form a second epitaxial layer including germanium over an interfacial layer between the substrate and the first epitaxial layer, the second epitaxial layer having a germanium concentration that is higher than a germanium concentration of the first epitaxial SiGe layer, thereby forming a second resultant structure.

27 Claims, 6 Drawing Sheets

SEMICONDUCTOR DEVICE AND METHOD FOR FABRICATING THE SAME

CROSS-REFERENCE TO RELATED APPLICATIONS

The present invention claims priority of Korean patent application number 10-2007-0062779, filed on Jun. 26, 2007, which is incorporated by reference in its entirety.

BACKGROUND OF THE INVENTION

The present invention relates to a semiconductor device and, more particularly, to a transistor in a semiconductor device and a method for fabricating the same.

As a semiconductor device becomes highly integrated, it has become increasingly important to fabricate a transistor capable of ensuring high current drivability while maintaining the margin of a channel length in a narrow area. In particular, it is essential for the fabrication of high speed products to ensure high current drivability.

According to the prior art, in order to ensure high current drivability, a method of scaling the thickness of a gate insulation layer has been employed. However, in a highly integrated semiconductor device, an equivalent oxide thickness (EOT) is less than 2 nm and thus current leakage occurs in the gate dielectric layer. Therefore, such a method has a limit in ensuring the high current drivability.

In order to overcome such a limitation, a technology capable of increasing the mobility of a carrier has been recently proposed. For example, U.S. Pat. No. 6,861,318 discloses a method for improving on-current by applying stress to a channel region formed below a gate to increase the mobility of a carrier. Hereinafter, the method will be described in more detail with reference to FIG. 1.

Figure 1:
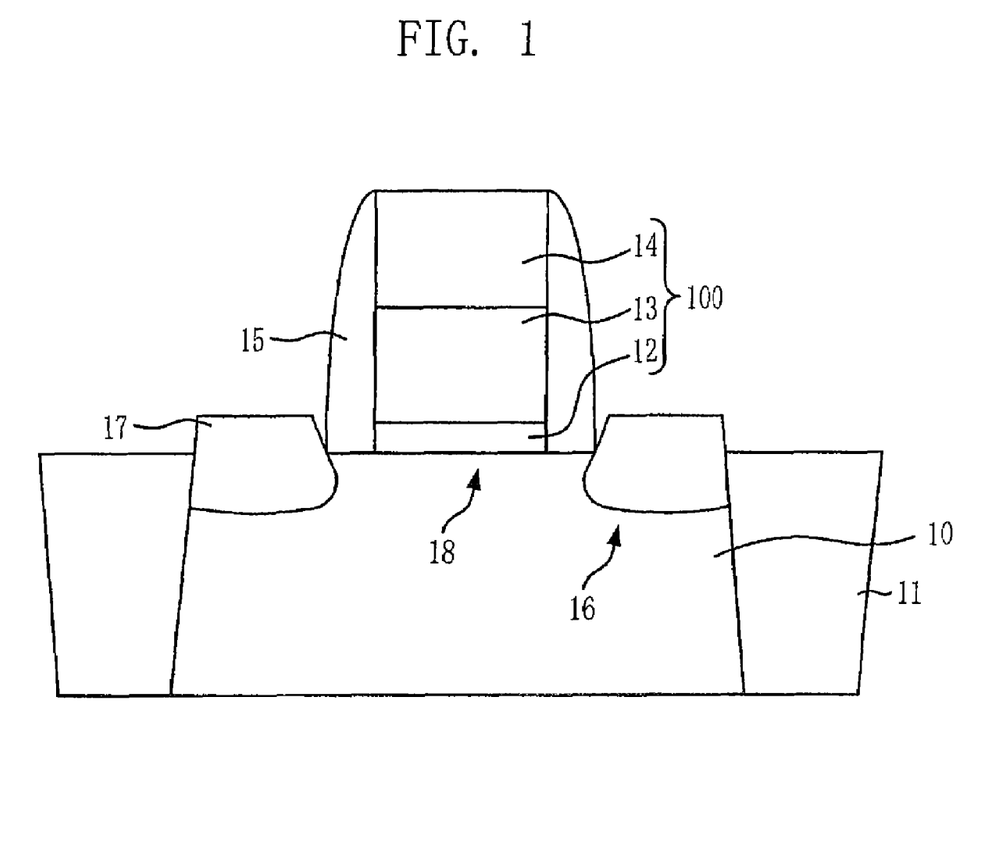
FIG. 1 illustrates a cross-sectional view of a method for fabricating a transistor in a semiconductor device according to the prior art.

FIG. 1 illustrates a cross-sectional view of a method for fabricating a transistor in a semiconductor device according to the prior art. Referring to FIG. 1, a PMOS transistor will be described as one example.

As shown in FIG. 1, an isolation layer 11 is formed on a substrate 10 to isolate an active region of the substrate 10. In general, the substrate 10 includes silicon. Then, a gate 100 including a gate insulation layer 12, a gate electrode 13 and a gate hard mask 14 is formed on the substrate 10.

After an insulation layer for a gate spacer is formed on the resultant structure including the gate 100, the entire surface of the insulation layer is etched to form a gate spacer 15 on both sidewalls of the gate 100. After the substrate 10 is etched using the gate 100 and the gate spacer 15 as an etch barrier to form a recess 16 in source/drain regions of the substrate 10, an epitaxial SiGe layer 17 is formed to fill the recess 16.

In the case of fabricating the transistor in such a manner, stress is applied to a channel region 18 due to the difference between the lattice constant of the substrate 10 including silicon and the lattice constant of the epitaxial SiGe layer 17, so that the mobility of a carrier is increased. Since the epitaxial SiGe layer 17 has a lattice constant larger than that of the substrate 10, the compressive stress is applied to the channel region 18 to increase hole mobility. In particular, the lattice constant of the epitaxial SiGe layer 17 is further increased as the mole fraction of germanium contained in the epitaxial SiGe layer 17 is increased. However, the fabricating method of the transistor as described above has the following problems.

First, the stress applied to the channel region 18, due to the difference between the lattice constant of the substrate 10 and the lattice constant of the epitaxial SiGe layer 17, is rapidly reduced as the width of the gate spacer 15 is increased (reference document: K. Ota, et al, "Scalable eSiGe S/D Technology with less layout dependence for 45 nm, VLSI 2006"). That is, since the stress applied to the channel region 18 is changed according to the width of the gate spacer 15, properly adjusting the degree of on-current based on the mobility of the carrier is difficult.

Furthermore, in order to increase the stress applied to the channel region 18 to increase the mobility of the carrier, it is preferable to increase the difference between the lattice constant of the substrate 10 and the lattice constant of the epitaxial SiGe layer 17. To this end, the mole fraction of germanium contained in the epitaxial SiGe layer 17 should be increased. However, if the mole fraction of germanium contained in the epitaxial SiGe layer 17 is increased beyond a certain level (e.g., mole fraction 0.2), a defect such as dislocation may occur in the epitaxial SiGe layer 17. Such a defect may cause current leakage.

SUMMARY OF THE INVENTION

Embodiments of the present invention relate to a transistor in a semiconductor device and a method for fabricating the same so that on-current is improved. According to the embodiments of the present invention, an epitaxial SiGe layer having a low germanium (Ge) concentration is formed to the extent that defect does not occur. Then, an epitaxial SiGe layer having a high germanium concentration is formed on the interfacial layer between a substrate and the epitaxial SiGe layer having the low germanium concentration through a high temperature oxidation process, so that the mobility of a carrier is increased while the occurrence of the defect and influence by the width of a gate spacer are reduced, resulting in improved on-current.

According to an aspect of the present invention, there is provided a method of fabricating a transistor, the method includes forming a gate over a substrate to form a first resultant structure, forming a gate spacer at first and second sidewalls of the gate, etching portions of the substrate proximate to the gate spacer to form a recess in a source/drain region of the substrate, forming a first epitaxial layer including germanium to fill the recess, and performing a high temperature oxidation process to form a second epitaxial layer including germanium over an interfacial layer between the substrate and the first epitaxial layer, the second epitaxial layer having a germanium concentration that is higher than a germanium concentration of the first epitaxial SiGe layer, thereby forming a second resultant structure.

According to another aspect of the present invention, there is provided a semiconductor device, the semiconductor device includes a substrate, a gate formed over the substrate, a gate spacer provided against first and second sidewalls of the gate, and a source/drain region formed in the substrate proximate to the gate spacer, wherein the source/drain region includes first and second epitaxial layers including Ge, wherein the second epitaxial layer which is formed over an interfacial layer between the first epitaxial layer and the substrate has a higher germanium concentration than that of the first epitaxial layer.

DESCRIPTION OF SPECIFIC EMBODIMENTS

Hereinafter, a semiconductor memory device in accordance with the present invention will be described in detail with reference to the accompanying drawings.

Figure 2A:
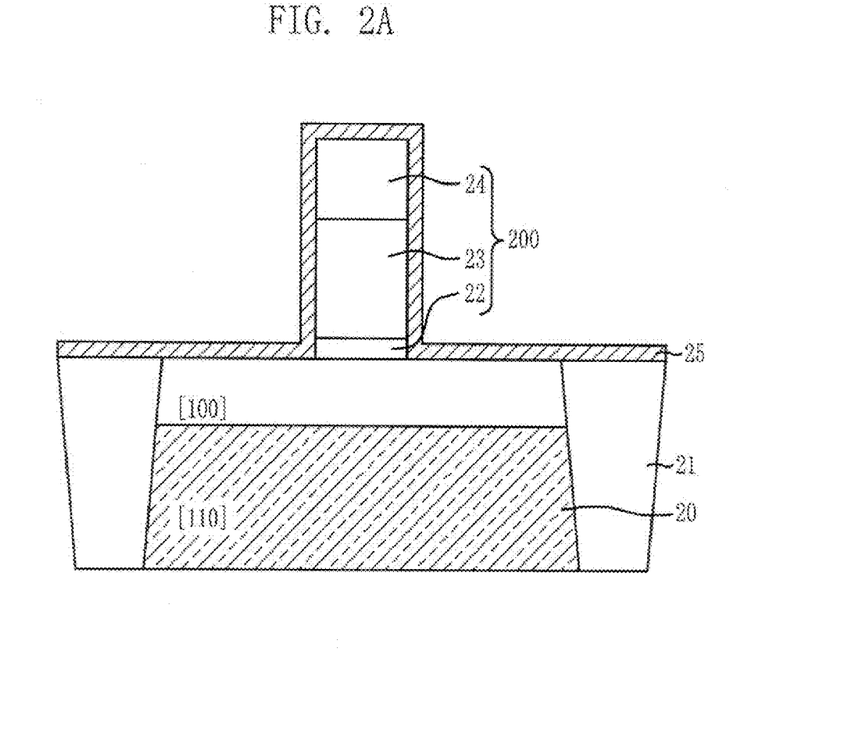
FIGS. 2A to 2H illustrate cross-sectional views of the procedure for fabricating a transistor in a semiconductor device according to one embodiment of the present invention.

As shown in FIG. 2A, according to one embodiment of the present invention an isolation layer 21 is formed on a substrate 20 through a shallow trench isolation (STI) process to isolate an active region of the substrate 20. The substrate 20 includes a silicon wafer, in which a flat zone or a notch is formed in the direction of [110] and the silicon wafer has a surface in the direction of [100]. The carrier direction of a channel is parallel to the direction of [110] relative to the substrate 20 having the surface in the direction of [100]. However, the present embodiment is not limited thereto. The references and are not shown in FIGS. 2B-2H for brevity. A silicon on insulator (SOI) substrate may also be used as the substrate 20.

Then, a gate 200, which includes a gate insulation layer 22, a gate electrode 23 and a gate hard mask 24, is formed on the substrate 20 by using the conventional method. The gate electrode 23 may use a polysilicon layer. Further, the gate electrode 23 may also use a stacking structure of a polysilicon layer and a metal layer or a stacking structure of a polysilicon layer and a metal silicide layer.

Next, a gate re-oxidation process is performed to prevent damage from occurring during an etching process for forming the gate 200.

Although not shown in the drawings, a low concentration ion implantation process is performed by using the gate 200 as a mask to form source/drain extension regions in the substrate 20 on both sides of the gate 200. This is to reduce the short channel effect of a transistor.

Thereafter, an etch stop layer 25 is formed on the surface profile of a resultant structure including the gate 200. The etch stop layer 25 prevents damage of the substrate 20 during the subsequent etching process for forming a gate spacer. Although the etch stop layer 25 may include a nitride layer, the etch stop layer 25 does not have to be formed if the situation does not require.

Figure 2B:
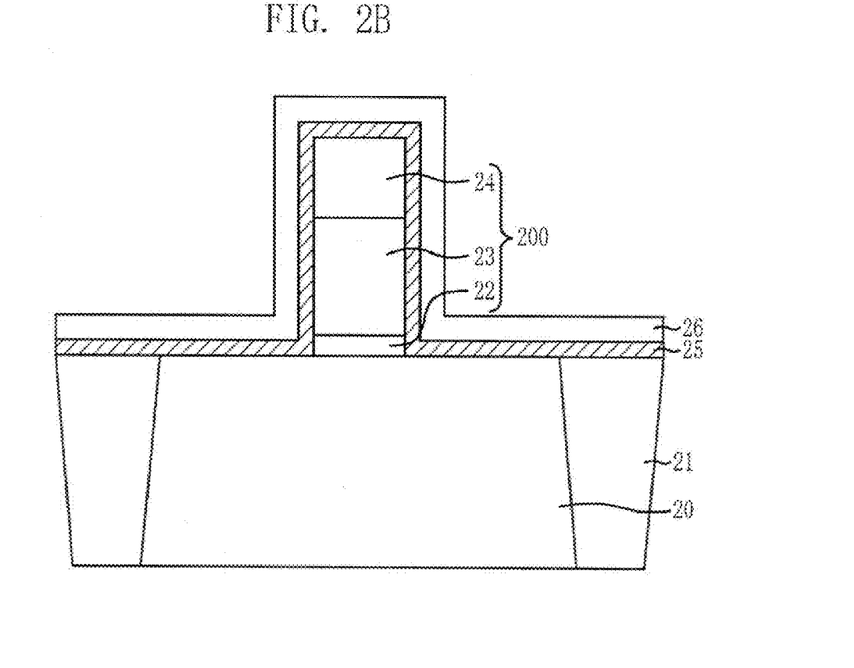

As shown in FIG. 2B, an insulation layer 26 for a gate spacer is deposited on the etch stop layer 25. The insulation layer 26 may include an oxide layer in order to ensure etching selectivity with the etch stop layer 25.

Figure 2C:
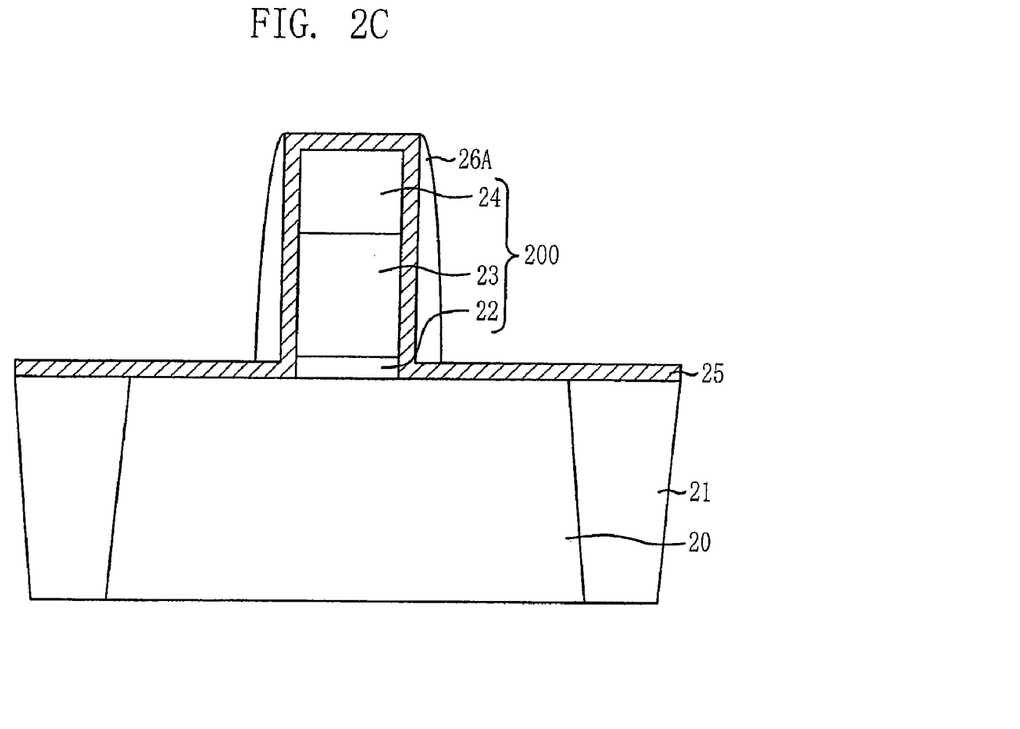

As shown in FIG. 2C, the entire surface of the insulation layer 26 is etched until the etch stop layer 25 is exposed, thereby forming a gate spacer 26A at both sidewalls of the gate 200.

Figure 2D:
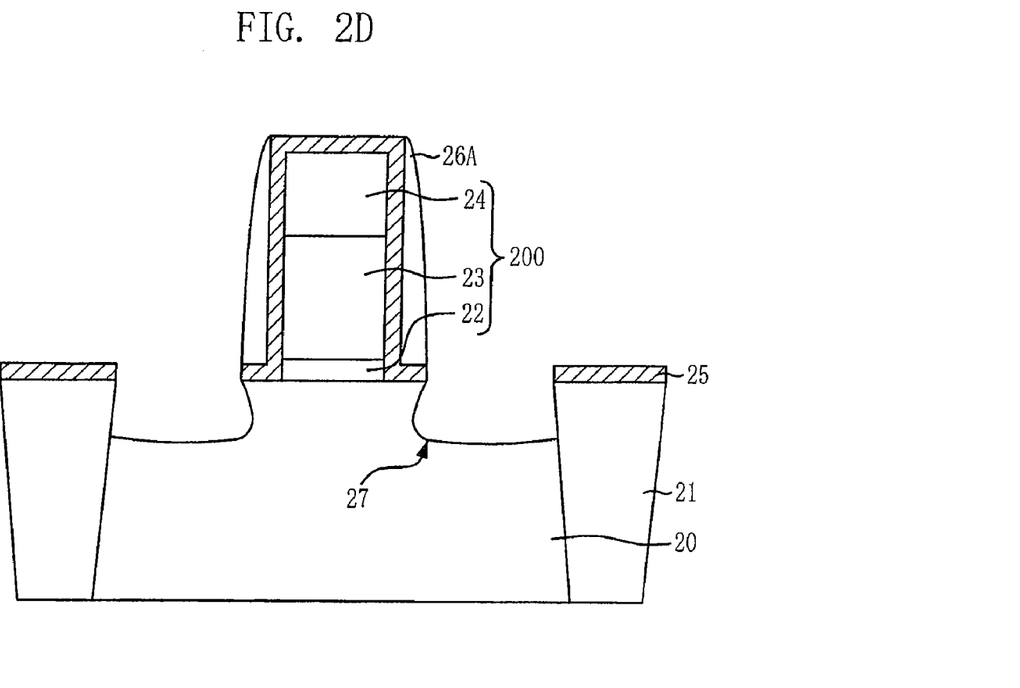

As shown in FIG. 2D, the etch stop layer 25 corresponding to both sides of the gate spacer 26A is removed, and then the substrate 20 is etched to form a recess 27 in the source/drain region of the substrate 20. The substrate 20 may be etched through a wet etching process representing isotropic characteristics under conditions of high etching selectivity relative to the oxide layer constituting the gate spacer 26A to form the recess 27. The recess 27 formed through the process may have a depth of 100 nm or less.

Figure 2E:
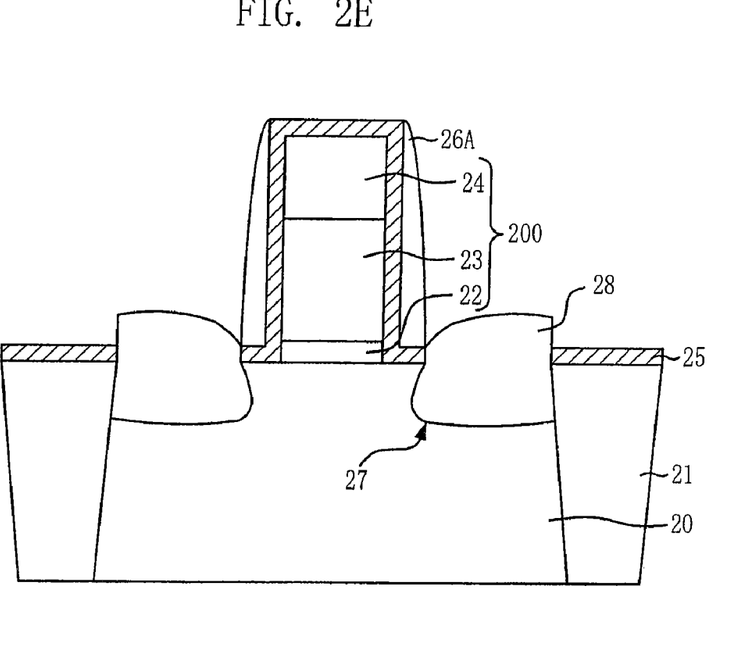

As shown in FIG. 2E, a first epitaxial SiGe layer 28 is formed to fill the recess 27. The germanium contained in the first epitaxial SiGe layer 28 should have a low concentration to the extent that a defect such as dislocation does not occur. The first epitaxial SiGe layer 28 may have a germanium concentration (i.e., mole fraction) lower than 0.2. The first epitaxial SiGe layer 28 may have a thickness greater than depth of the recess 27, that is, a part of the first epitaxial SiGe layer 28 may protrude on the surface of the substrate 20. The first epitaxial SiGe layer 28 having such a low germanium concentration may be formed using a base gas selected from a group consisting of HCl, $Cl_2$, dichlorosilane (DCS), $SiH_4$, and a combination thereof. When forming the first epitaxial SiGe layer 28, the substrate 20 may have a temperature less than 750° C. In order to reduce the temperature of the substrate 20, a pre-baking process may also be additionally performed under $H_2$ atmosphere before forming the first epitaxial SiGe layer 28. Then, boron is doped on the first epitaxial SiGe layer 28. The boron may have a doping concentration ranging from approximately $5 \times 10^{19}$ atoms/cm$^3$ to approximately $5 \times 10^{20}$ atoms/cm$^3$. In order to prevent the doped boron from being diffused into the substrate 20 through a subsequent thermal process, an undoped SiGe layer (not shown) having a thickness of about 10 nm may also be additionally formed before doping the boron.

Figure 2F:
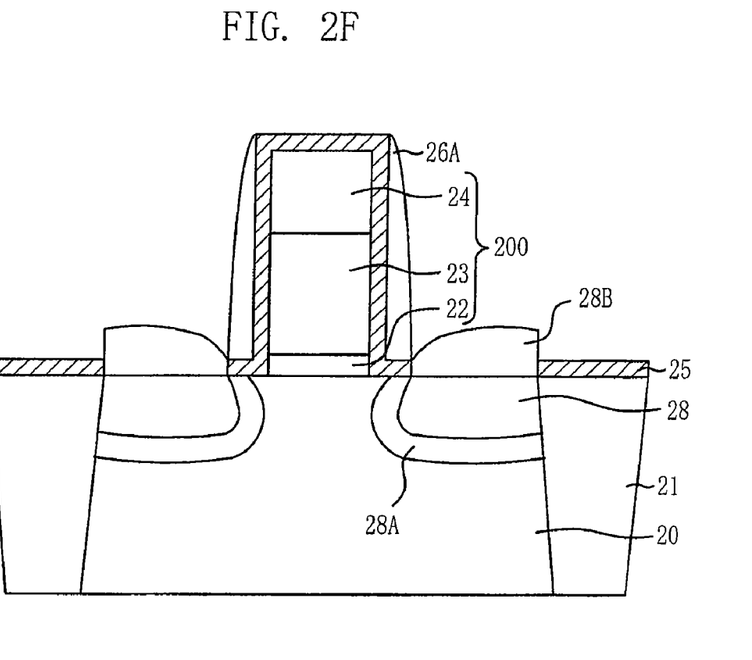

As shown in FIG. 2F, a high temperature oxidation process is performed. As a result, a part of the first epitaxial SiGe layer 28 making contact with the substrate 20 changes into a second epitaxial SiGe layer 28A having a germanium concentration higher than that of the first epitaxial SiGe layer 28. That is, the second epitaxial SiGe layer 28A having a high germanium concentration is formed on the interfacial surface between the substrate 20 and the first epitaxial SiGe layer 28. Simultaneously, an upper portion of the first epitaxial SiGe layer 28 that protrudes on the surface of the substrate 20 changes into a $SiO_2$ layer 28B. Such a process will be described in more detail with reference to FIG. 3.

Figure 3:
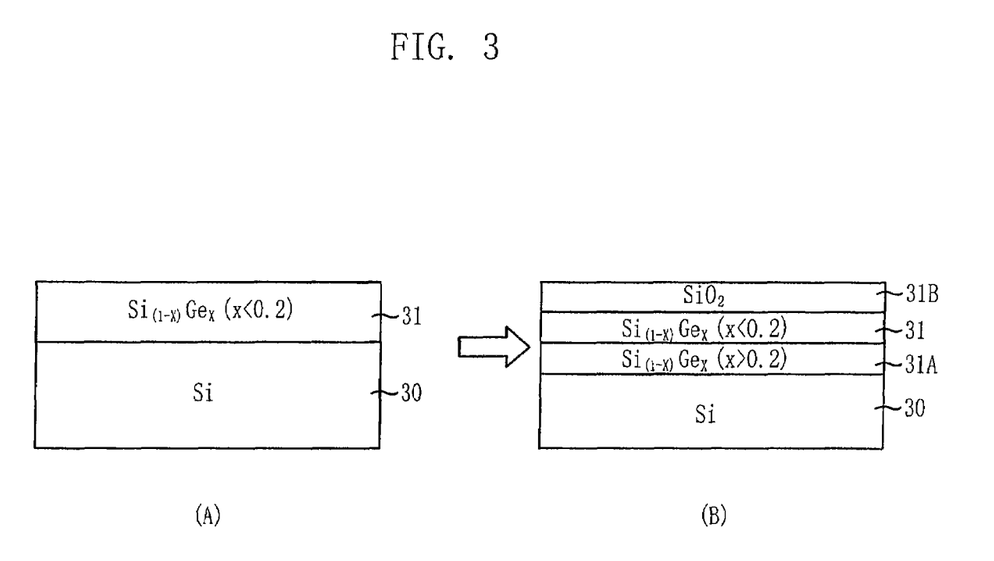
FIG. 3 illustrates a high temperature oxidation process relative to the epitaxial SiGe layer of FIG. 2F.

Referring to A in FIG. 3, an epitaxial SiGe layer 31 is formed on a silicon substrate 30. The epitaxial SiGe layer 31 has a mole fraction of germanium of less than 0.2. That is, in the epitaxial $Si_{1-X}Ge_X$ layer, X has a value less than 0.2. Then, the high temperature oxidation process is performed relative to the resultant structure. At this time, the following relations are established.

<Relations>

Referring to the Equations, when $GeO_2$ reacts with Si due to the Gibbs energy difference ($\Delta G$), $SiO_2$ is formed and germanium is extracted. The extracted germanium is diffused into a non-reacted SiGe layer to increase the germanium content of the SiGe layer.

Accordingly, as shown B in FIG. 3, an upper portion of the epitaxial SiGe layer 31 changes into the $SiO_2$ layer 31B, and the lower portion of the epitaxial SiGe layer 31 (i.e., the part being in contact with the silicon substrate) changes into an epitaxial SiGe layer 31A having a high germanium concentration due to the diffusion of Ge. That is, in the epitaxial $Si_{1-X}Ge_X$ layer, X has a value larger than 0.2.

In other words, the epitaxial SiGe layer 31 having a low germanium concentration (e.g., mole fraction of less than 0.2) changes through the high temperature oxidation process, thereby forming the structure in which the epitaxial SiGe layer having a high germanium concentration 31A (e.g., mole fraction of more than 0.2), the epitaxial SiGe layer having a low germanium concentration 31 (e.g., mole fraction of less than 0.2), and the $SiO_2$ layer 31B are sequentially stacked on the silicon substrate.

The high temperature oxidation process as described above can be performed under $O_2$ or $H_2O$ atmosphere at a temperature of approximately 500° C. or more.

Figure 2G:
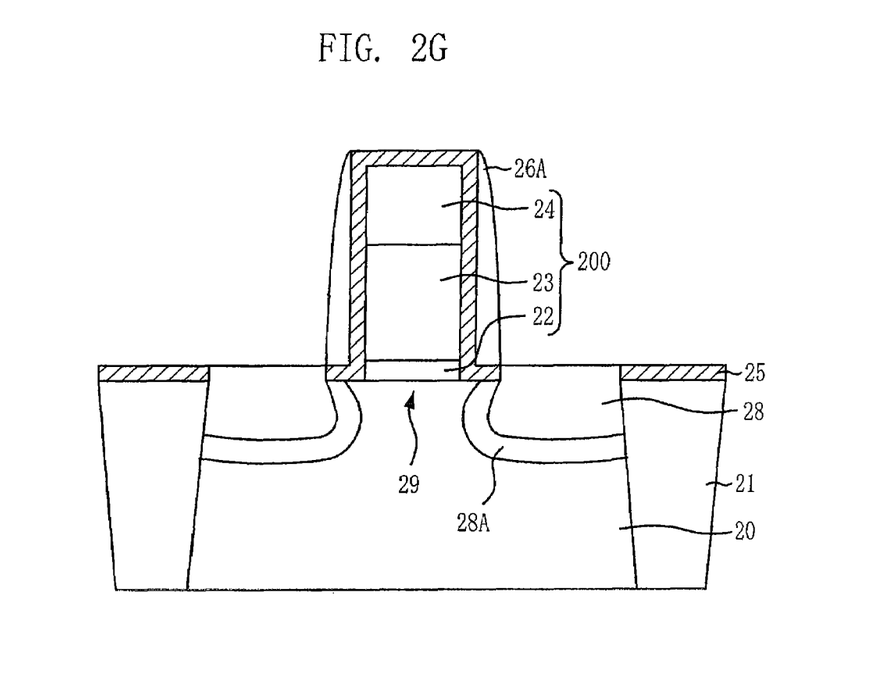

As shown in FIG. 2G, the SiO₂ layer 28B is removed through a wet etching process. As described above, since the second epitaxial SiGe layer 28A having a high germanium concentration can be formed on the interfacial layer between the substrate 20 and the first epitaxial SiGe layer 28 through the processes of FIGS. 2E to 2G, the stress applied to a channel region 29 can be increased while an occurrence of defects and an influence by a width of the gate spacer are decreased. Accordingly, the mobility of carriers can be increased so that on-current can be improved.

Figure 2H:
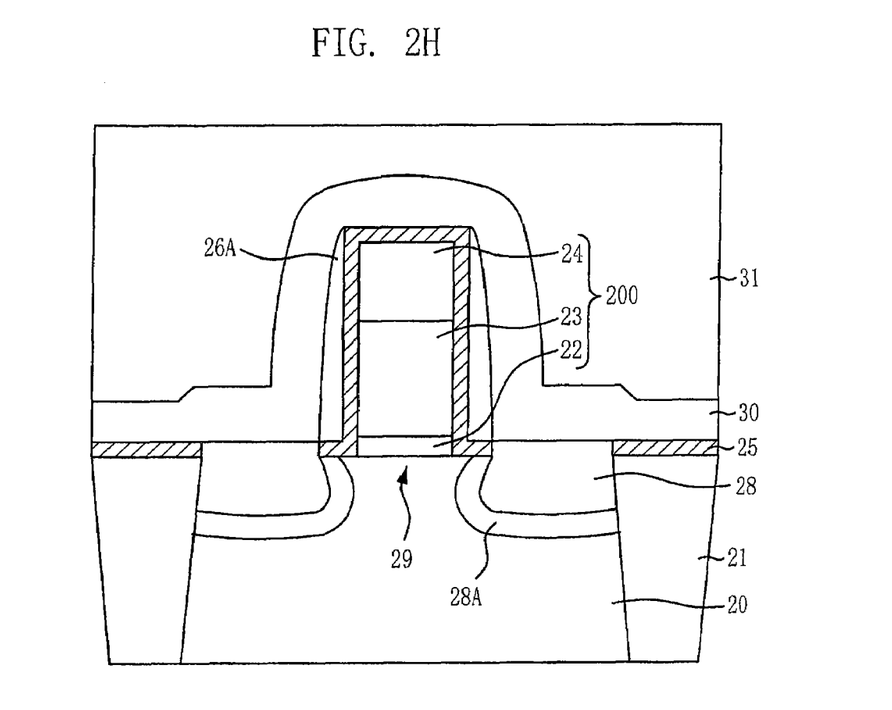

As shown in FIG. 2H, in order to prevent a short-circuit during a subsequent landing plug contact process, a nitride layer 30, an interlayer insulation layer 31, or the like can be additionally formed on the resultant structure as a protection layer for etching.

Although embodiments of the present invention have been described for illustrative purposes, those skilled in the art will appreciate that various modifications, additions and substitutions are possible, without departing from the scope and spirit of the invention as disclosed in the accompanying claims.

For example, although the present invention is applied to the PMOS transistor, it is not limited thereto. It can also be applied to a NMOS transistor formed using a nitride layer having a tensile stress as a gate spacer.

According to the transistor in the semiconductor device and the method for fabricating the same as described above, the epitaxial SiGe layer having a low germanium concentration to the extent that defect does not occur is formed, and then the epitaxial SiGe layer having the high germanium concentration is formed on the interfacial layer between the substrate and the epitaxial SiGe layer having the low germanium concentration through the high temperature oxidation process, so that the mobility of the carrier can be increased while the occurrence of the defect and influence by the width of the gate spacer are reduced, resulting in improved on-current.

While the present invention has been described with respect to the specific embodiments, the above embodiment of the present invention is illustrative and not limitative. It will be apparent to those skilled in the art that various changes and modifications may be made without departing from the spirit and scope of the invention as defined in the following claims.

What is claimed is:

1. A method for fabricating a transistor, the method comprising:
    forming a gate over a substrate to form a first resultant structure;
    forming a gate spacer at first and second sidewalls of the gate;
    etching portions of the substrate proximate to the gate spacer to from a recess in a source/drain region of the substrate;
    forming a first epitaxial layer including germanium to fill the recess; and
    performing a high temperature oxidation process to form a second epitaxial layer including germanium over an interfacial layer between the substrate and the first epitaxial layer, the second epitaxial layer having a germanium concentration that is higher than a germanium concentration of the first epitaxial SiGe layer, thereby forming a second resultant structure.

2. The method of claim 1, wherein the substrate includes a silicon substrate.

3. The method of claim 2, wherein the substrate includes a flat zone or a notch having a direction of [110] and a surface having a direction of [100].

4. The method of claim 1, wherein the substrate includes a silicon on insulator substrate.

5. The method of claim 3, wherein a channel, which is formed in the substrate below the gate, includes a carrier having a direction parallel to [110].

6. The method of claim 1, further comprising, after forming the gate:
    performing a gate re-oxidation process; and
    forming a source/drain extension region in the substrate on first and second sides of the gate through an ion implantation process.

7. The method of claim 1, further comprising forming an etch stop layer over a surface profile of the first resultant structure after the gate is formed.

8. The method of claim 7, wherein the etch stop layer includes a nitride layer.

9. The method of claim 1, wherein the gate spacer includes an oxide layer.

10. The method of claim 1, wherein forming the recess is performed using an etch process that etches the substrate faster than the gate spacer.

11. The method of claim 1, wherein the recess is formed using a wet etch process.

12. The method of claim 1, wherein the recess has a depth of approximately 100 nm or less.

13. The method of claim 1, wherein a mole fraction of germanium contained in the first epitaxial layer is less than 0.2.

14. The method of claim 1, wherein the first epitaxial layer is formed by using one selected from a group consisting of HCl, $Cl_2$, dichlorosilane, and $SiH_4$, and the combination thereof, as a base gas.

15. The method of claim 1, wherein the first epitaxial layer is formed in a state in which the substrate has a temperature of approximately 750 Celsius or less.

16. The method of claim 1, further comprising performing a prebaking process under $H_2$ atmosphere before forming the first epitaxial layer.

17. The method of claim 1, further comprising doping boron in the first epitaxial layer after forming the first epitaxial layer.

18. The method of claim 17, wherein the doped boron has a concentration ranging from approximately $5 \times 10^{19}$ atoms/$cm^3$ to approximately $5 \times 10^{20}$ atoms/$cm^3$.

19. The method of claim 17, further comprising forming an undoped SiGe layer before doping the boron in the first epitaxial layer.

20. The method of claim 13, wherein a mole fraction of germanium contained in the second epitaxial layer is more than 0.2.

21. The method of claim 1, wherein the first epitaxial layer has a thickness greater than a depth of the recess and is a SiGe layer.

22. The method of claim 1, wherein the high temperature oxidation process is performed at a temperature of approximately 500 Celsius or more.

23. The method of claim 22, wherein the high temperature oxidation process is performed in atmosphere including $O_2$ or $H_2O$, or both.

24. The method of claim 1, wherein while the second epitaxial layer is being formed, an upper portion of the first epitaxial layer is converted to an oxide layer.

25. The method of claim 24, further comprising removing the oxide layer after forming the second epitaxial layer.

26. The method of claim 25, wherein the oxide layer is removed by using a wet etch process.

27. The method of claim 1, further comprising, after forming the second epitaxial layer:
forming an etching protection layer over the second resultant structure; and
forming an interlayer insulation layer over the etch protection layer.

* * * * *